(12) United States Patent
Sugiyama et al.

(10) Patent No.: US 11,762,032 B2
(45) Date of Patent: Sep. 19, 2023

(54) DIAGNOSIS METHOD OF BATTERY, DIAGNOSIS DEVICE OF BATTERY, DIAGNOSIS SYSTEM OF BATTERY, BATTERY-MOUNTED DEVICE, AND NON-TRANSITORY STORAGE MEDIUM

(71) Applicant: KABUSHIKI KAISHA TOSHIBA, Tokyo (JP)

(72) Inventors: Nobukatsu Sugiyama, Kawasaki (JP); Yumi Fujita, Tokyo (JP); Tomokazu Morita, Funabashi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 7 days.

(21) Appl. No.: 17/460,987

(22) Filed: Aug. 30, 2021

(65) Prior Publication Data
US 2022/0260645 A1  Aug. 18, 2022

(30) Foreign Application Priority Data

Feb. 10, 2021  (JP) ................... 2021-019613

(51) Int. Cl.
*G01R 31/392*  (2019.01)
*G01R 31/367*  (2019.01)
*G01R 31/389*  (2019.01)

(52) U.S. Cl.
CPC ......... *G01R 31/392* (2019.01); *G01R 31/367* (2019.01); *G01R 31/389* (2019.01)

(58) Field of Classification Search
CPC ............................ G01R 31/392; G01R 31/367
See application file for complete search history.

(56) References Cited

U.S. PATENT DOCUMENTS

| | | | |
|---|---|---|---|
| 10,871,522 B2 | 12/2020 | Ishii et al. | |
| 2013/0027047 A1* | 1/2013 | Yoshioka | G01R 31/389 |
| | | | 324/426 |
| 2015/0369873 A1* | 12/2015 | Nakao | G01R 31/392 |
| | | | 702/63 |
| 2018/0076633 A1* | 3/2018 | Fujita | H01M 10/425 |
| 2020/0033414 A1 | 1/2020 | Izumi et al. | |
| 2020/0041570 A1 | 2/2020 | Izumi et al. | |
| 2020/0393518 A1* | 12/2020 | Takegami | H02J 7/0013 |
| 2021/0001747 A1* | 1/2021 | Shimura | B60L 50/60 |
| 2021/0021000 A1* | 1/2021 | Sada | B60L 58/16 |
| 2021/0033680 A1 | 2/2021 | Ukumori | |

(Continued)

FOREIGN PATENT DOCUMENTS

| | | |
|---|---|---|
| EP | 2 530 482 A2 | 12/2012 |
| JP | 2012-251806 A | 12/2012 |
| JP | 2014-193040 A | 10/2014 |

(Continued)

*Primary Examiner* — Raymond L Nimox
(74) *Attorney, Agent, or Firm* — Oblon, McClelland, Maier & Neustadt, L.L.P.

(57) ABSTRACT

According to an embodiment, a diagnosis method of a battery is provided. In the diagnosis method, a similarity to a measurement result of a voltage of the battery is calculated in regard to each of a plurality of voltage arithmetic data calculated by setting an internal state in mutually different states in a voltage model of the battery. In the diagnosis method, a deterioration state of the battery is determined based on the similarity calculated in regard to each of the voltage arithmetic data.

8 Claims, 5 Drawing Sheets

(56) References Cited

U.S. PATENT DOCUMENTS

2022/0082630 A1* 3/2022 Takaoka ............. G01R 31/3842

FOREIGN PATENT DOCUMENTS

| JP | 2015-111086 A | 6/2015 |
| JP | 2019-168453 A | 10/2019 |
| JP | 2020-20604 A | 2/2020 |
| JP | 2020-21592 A | 2/2020 |
| JP | 2022-133614 A | 9/2022 |

* cited by examiner

DIAGNOSIS METHOD OF BATTERY, DIAGNOSIS DEVICE OF BATTERY, DIAGNOSIS SYSTEM OF BATTERY, BATTERY-MOUNTED DEVICE, AND NON-TRANSITORY STORAGE MEDIUM

CROSS-REFERENCE TO RELATED APPLICATIONS

This application is based upon and claims the benefit of priority from Japanese Patent Application No. 2021-019613, filed Feb. 10, 2021; the entire contents of which are incorporated herein by reference.

FIELD

Embodiments relate to a diagnosis method of a battery, a diagnosis device of a battery, a diagnosis system of a battery, a battery-mounted device, and a non-transitory storage medium.

BACKGROUND

With the popularization of information-related devices and communication devices, secondary batteries have been widely applied as power sources of devices. In addition, secondary batteries have been utilized in fields of electric vehicles (EV), natural energy, and the like. In particular, lithium ion secondary batteries are widely used since the lithium ion secondary batteries have high energy density and can be reduced in size. Furthermore, with an increasing popularity of vehicles, such as electric automobiles, in which many lithium ion secondary batteries are mounted, attention is paid to reusing the batteries, such as lithium ion secondary batteries, which have been mounted in the vehicles at the time of discarding the vehicles. In the reuse of batteries, batteries mounted in the vehicles are collected, and batteries, among the collected batteries, which are reusable, are reused, for example, as storage batteries which will serve as stationary power sources or household power sources.

The secondary battery, such as a lithium ion secondary battery, deteriorates with the passing of time from the start of use, and also deteriorates by repetition of charge and discharge. Thus, when the batteries are reused as described above, it is important to ascertain the deterioration state of the batteries or the like, which were mounted in the vehicles. Examples of the index, which is indicative of the deterioration state of a battery, include a battery capacitance and an internal resistance of the battery, and internal state parameters indicative of the internal states of the battery, such as a positive electrode capacitance (or a positive electrode mass) and a negative electrode capacitance (or a negative electrode mass) In order to efficiently and properly select batteries to be reused, from among many collected batteries, it is required to quickly and efficiently estimate the index or the like which is indicative of the above-described deterioration state in regard to each of the collected batteries, and to properly estimate the index or the like indicative of the deterioration state. In other words, it is required to quickly and efficiently perform the determination of the deterioration state of the battery, and to properly determine the deterioration state of the battery.

DETAILED DESCRIPTION

According to an embodiment, a diagnosis method of a battery is provided. In the diagnosis method, a similarity to a measurement result of a voltage of the battery is calculated in regard to each of a plurality of voltage arithmetic data calculated by setting an internal state in mutually different states in a voltage model of the battery. In the diagnosis method, a deterioration state of the battery is determined based on the similarity calculated in regard to each of the voltage arithmetic data.

Hereinafter, embodiments will be described with reference to the accompanying drawings.

First Embodiment

Figure 1:
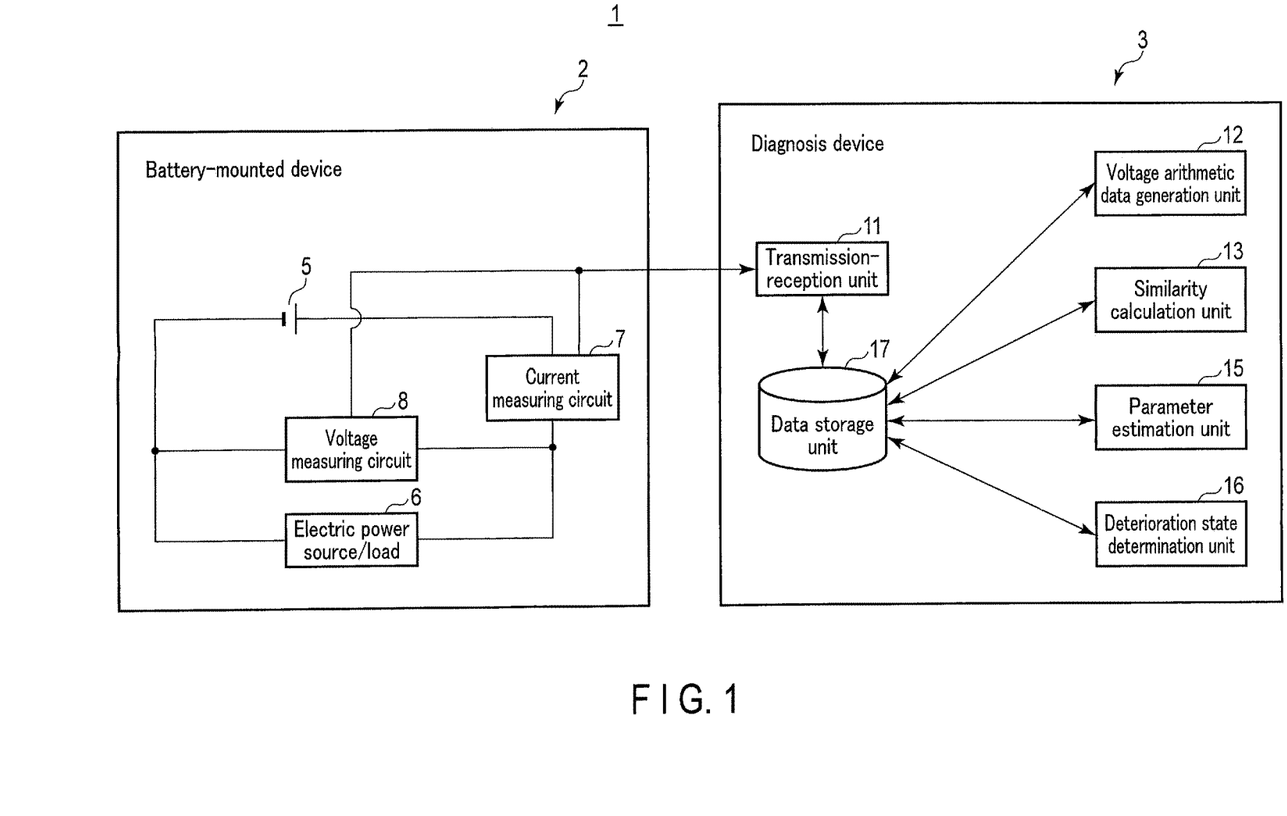
FIG. 1 is a schematic view illustrating a diagnosis system of a battery according to a first embodiment.

To begin with, a first embodiment will be described as one example of embodiments. FIG. 1 illustrates a diagnosis system 1 of a battery 5 according to the first embodiment. As illustrated in FIG. 1, the diagnosis system 1 includes a battery-mounted device 2 and a diagnosis device 3. The battery 5 is mounted in the battery-mounted device 2. Examples of the battery-mounted device 2 include a large-sized electricity storage device for an electric power system, a smartphone, a vehicle, a household power source device, a stationary power source device, a robot, and a drone. Examples of the vehicle serving as the battery-mounted device 2 include a railway vehicle, an electric bus, an electric automobile, a plug-in hybrid automobile, and an electric bicycle.

The battery 5 is, for example, a secondary battery such as a lithium ion secondary battery. The battery 5 may be formed of a unit cell (unit battery), or may be a battery module or a cell block formed by electrically connecting a plurality of unit cells. When the battery 5 is formed of a plurality of unit cells, the unit cells may be electrically connected in series, or may be electrically connected in parallel, in the battery 5. In addition, in the battery 5, both of a series-connection structure in which unit cells are connected in series, and a parallel-connection structure in which unit cells are connected in parallel, may be formed. Furthermore, the battery 5 may be any one of a battery string, a battery array and a storage battery, in each of which a plurality of battery modules are electrically connected.

In the diagnosis system 1, an electric power source and a load (indicated by reference sign 6) are provided. The electric power supply can supply electric power to the battery 5, and the battery 5 is charged by being supplied with electric power from the electric power source or the like. Electric power can be supplied to the load from the battery 5, and the battery 5 discharges by supplying electric power to the load or the like. Examples of the electric power source include a battery different from the battery 5, and a generator. Examples of the load include an electric motor and a light. In one example, an electricity storage, to which electric power is supplied from the battery 5, may be provided in place of the load or in addition to the load. In this case, the battery 5 discharges by supplying electric power to the electricity storage. In addition, the electricity storage can store electric power supplied from the battery 5. In another example, a motor generator may be provided. In this case, electric power can be supplied to the motor generator from the battery 5, and electric power can be supplied to the battery 5 from the motor generator. Specifically, the motor generator functions as both the electric power source and the load. Note that in FIG. 1, the electric power source and the load are mounted in the battery-mounted device 2, but the embodiment is not limited to this. The battery 5 may supply electric power to a load on the outside of the battery-mounted device 2, or the battery 5 may be supplied with electric power from an electric power source on the outside of the battery-mounted device 2.

In addition, in the diagnosis system 1, a current measuring circuit 7 and a voltage measuring circuit 8 are provided. The current measuring circuit 7 and voltage measuring circuit 8 constitute measuring circuitry which measures parameters relating to the battery 5. The current measuring circuit 7 measures an electric current flowing in the battery 5 in the charge and discharge, or the like, of the battery 5. The voltage measuring circuit 8 measures a voltage of the battery 5 in the charge and discharge, or the like, of the battery 5. In the charge or discharge, or the like, of the battery 5, the current measuring circuit 7 measures electric current at each of a plurality of measuring time points, and the voltage measuring circuit 8 measures voltage at each of a plurality of measuring time points. Note that in the example of FIG. 1, the measuring circuitry, such as the current measuring circuit 7 and voltage measuring circuit 8, is mounted in the battery-mounted device 2, but the measuring circuitry may be provided outside the battery-mounted device 2. Besides, in the charge and discharge, or the like, of the battery 5, the measuring circuitry may measure the temperature of the battery 5, in addition to the electric current and voltage of the battery 5. In this case, too, the measuring circuitry measures the temperature at each of a plurality of measuring time points.

The diagnosis device 3 performs diagnosis relating to the battery 5, such as by determining the deterioration state of the battery 5. Thus, the battery 5 serves as a diagnosis target by the diagnosis device 3. In the example of FIG. 1, or the like, the diagnosis device 3 is provided outside the battery-mounted device 2. The diagnosis device 3 includes a transmission-reception unit 11, a voltage arithmetic data generation unit 12, a similarity calculation unit 13, a parameter estimation unit 15, a deterioration state determination unit 16, and a data storage unit 17. The diagnosis device 3 is, for example, a server which can communicate with the battery-mounted device 2 (a processing device mounted in the battery-mounted device 2) via a network. In this case, the diagnosis device 3 includes a processor and a non-transitory storage medium.

The processor includes any one of a CPU (Central Processing Unit), an ASIC (Application Specific Integrated Circuit), a microcomputer, an FPGA (Field Programmable Gate Array), a DSP (Digital Signal Processor), and the like. The non-transitory storage medium may include an auxiliary storage device, in addition to a main storage device such as a memory. Examples of the non-transitory storage medium include a magnetic disk, an optical disc (e.g. CD-ROM, CD-R, DVD), a magneto-optical disc (e.g. MO), and a semiconductor memory. In the diagnosis device 3, each of the number of processors and the number of non-transitory storage media may be one or plural. In the diagnosis device 3, the processor executes a program or the like stored in the non-transitory storage medium or the like, thereby executing a process. In addition, the program that is executed by the processor of the diagnosis device 3 may be stored in a computer (server) connected to the diagnosis device 3 via a network such as the Internet, or may be stored in a server or the like in a cloud environment. In this case, the processor downloads the program via the network. In the diagnosis device 3, the transmission-reception unit 11, voltage arithmetic data generation unit 12, similarity calculation unit 13, parameter estimation unit 15 and deterioration state determination unit execute parts of processes which are executed by the processor or the like, and the non-transitory storage medium functions as the data storage unit 17.

Note that, in one example, the diagnosis device 3 may be a cloud server which is constructed in a cloud environment. The infrastructure of the cloud environment is constituted by a virtual processor such as a virtual CPU, and a cloud memory. Thus, when the diagnosis device 3 is the cloud server, parts of processes executed by the virtual processor are executed by the transmission-reception unit 11, voltage arithmetic data generation unit 12, similarity calculation unit 13, parameter estimation unit 15 and deterioration state determination unit 16. In addition, the cloud memory functions as the data storage unit 17.

Furthermore, the data storage unit 17 may be provided in a computer which is separate from the battery-mounted device 2 and diagnosis device 3. In this case, the diagnosis device 3 is connected via a network to the computer in which the data storage unit 17 or the like is provided. In addition, the diagnosis device 3 may be mounted in the battery-mounted device 2. In this case, the diagnosis device 3 is constituted by a processing device or the like, which is mounted in the battery-mounted device 2. Besides, when the diagnosis device 3 is mounted in the battery-mounted device 2, one processing device or the like, which is mounted in the battery-mounted device 2, may execute a process (to be described later) of the diagnosis device 3, and may execute control or the like of the charge and discharge of the battery 5. Hereinafter, the process of the diagnosis device 3 will be described.

The transmission-reception unit 11 communicates with the processing device other than the diagnosis device 3, such as the processing device of the battery-mounted device 2, via the network. When the battery 5 is diagnosed by the diagnosis device 3, the above-described parameters relating to the battery 5 are measured by the measuring circuitry or the like, in the state in which the battery 5 is being charged or discharged, for example. In addition, the transmission-reception unit 11 receives, for example, the measurement data including the measurement result in the measuring circuitry of the parameters relating to the battery 5, from the battery-mounted device 2. The measurement data include a measurement result in the current measuring circuit 7 of the electric current flowing in the battery 5, and a measurement result in the voltage measuring circuit 8 of the voltage of the battery 5, and may also include a measurement result of the temperature of the battery 5, for example. The measurement data include measurement values of the parameters relating to the battery 5 at each of a plurality of measuring time points (a plurality of times of measurement). In addition, the measurement data include time variations (time histories) of the parameters relating to the battery 5. Accordingly, the measurement data include a time variation (time history) of the electric current of the battery 5, and a time variation (time history) of the voltage of the battery 5, for example.

Furthermore, at least one of the processing device of the battery-mounted device 2 and the processor of the diagnosis device 3 may estimate a charge amount of the battery 5, based on the measurement result of the parameters relating to the battery 5, for example. In this case, the transmission-reception unit 11 or the like of the diagnosis device 3 may acquire, as data included in the above-described measurement data, an estimation value of the charge amount of the battery 5, and the time variation (time history) of the estimation value of the charge amount of the battery 5. In addition, the measurement data may include data indicative of a relation of the above-described measured parameters relating to the battery 5 to the estimated charge amount of the battery 5. In this case, for example, the data indicative of the relation of the measured voltage of the battery 5 to the estimated charge amount of the battery 5 is included in the measurement data.

A real-time charge amount of the battery 5 can be calculated based on the charge amount of the battery 5 at a time of, for example, the start of charge or discharge, and the time variation of the electric current of the battery 5. In this case, based on the time variation of the electric current, a current integration value of the electric current of the battery 5 from the start time of charge or discharge is calculated. Further, the charge amount of the battery 5 is calculated based on the charge amount of the battery at the time of, for example, the start of charge or discharge, and the calculated current integration value. The transmission-reception unit 11 writes the received measurement data or the like into the data storage unit 17. The data storage unit 17 stores a voltage model of the battery 5, and data relating to the voltage model. In the voltage model of the battery 5, a relation of the voltage of the battery 5 to each of the charge amount of the battery 5 and the internal state of the battery 5, for example, is indicated. Besides, in the voltage model, the internal state of the battery 5 can be set, and one or more internal state parameters indicative of the internal state of the battery 5 can be set. In the voltage model, for example, a function or a calculation formula, or the like, for calculating the voltage of the battery 5, with each of the charge amount of the battery 5 and the set internal state parameter being used as a variable, is indicated.

Here, in the battery 5, a lower-limit electric potential and an upper-limit electric potential are defined for a positive electrode electric potential, and the positive electrode electric potential varies between the lower-limit electric potential and the upper-limit electric potential in accordance with the variation of the charge amount of the positive electrode. The positive electrode electric potential increases as the charge amount of the positive electrode becomes greater. In addition, the charge amount of the positive electrode in the state in which the positive electrode electric potential becomes the lower-limit electric potential is defined as an initial charge amount of the positive electrode, and the charge amount of the positive electrode in the state in which the positive electrode electric potential becomes the upper-limit electric potential is defined as an upper-limit charge amount of the positive electrode. In addition, in the battery 5, a charge amount from the initial charge amount of the positive electrode to the upper-limit charge amount of the positive electrode is a positive electrode capacitance which is equivalent to a chargeable/dischargeable amount of the positive electrode. The positive electrode capacitance may be indicated by a unit such as (mA·h), or may be indicated by a ratio to the capacitance at the time of the start of use of the battery 5, i.e. a positive electrode capacity retention ratio.

Like the positive electrode, in the battery 5, a lower-limit electric potential and an upper-limit electric potential are defined for a negative electrode electric potential, and the negative electrode electric potential varies between the lower-limit electric potential and the upper-limit electric potential in accordance with the variation of the charge amount of the negative electrode. The negative electrode electric potential decreases as the charge amount of the negative electrode becomes greater. In addition, the charge amount of the negative electrode in the state in which the negative electrode electric potential becomes the upper-limit electric potential is defined as an initial charge amount of the negative electrode, and the charge amount of the negative electrode in the state in which the negative electrode electric potential becomes the lower-limit electric potential is defined as an upper-limit charge amount of the negative electrode. In addition, in the battery 5, a charge amount from the initial charge amount of the negative electrode to the upper-limit charge amount of the negative electrode is a negative electrode capacitance which is equivalent to a chargeable/dischargeable amount of the negative electrode. The negative electrode capacitance may be indicated by a unit such as (mA·h), or may be indicated by a ratio to the capacitance at the time of the start of use of the battery 5, i.e. a negative electrode capacity retention ratio.

The internal state parameters of the battery 5 include the above-described positive electrode capacitance, negative electrode capacitance, initial charge amount of the positive electrode, and initial charge amount of the negative electrode. In addition, the internal state parameters of the battery 5 include a positive electrode mass which is a parameter corresponding to the positive electrode capacitance, and a negative electrode mass which is a parameter corresponding to the negative electrode capacitance. The positive electrode mass can be calculated based on the positive electrode capacitance and the kind of material, of which the positive electrode is formed. Similarly, the negative electrode mass can be calculated based on the negative electrode capacitance and the kind of material, of which the negative electrode is formed. Furthermore, the internal state parameters of the battery 5 include an SOW (Shift of Operation Window) which is a shift between the initial charge amount of the positive electrode and the initial charge amount of the negative electrode. Besides, the internal state parameters of the battery 5 include a parameter relating to the internal resistance of the battery 5, a parameter relating to the resistance of the positive electrode, and a parameter relating to the resistance of the negative electrode.

In one example, in the above-described voltage model of the battery 5, five internal state parameters, namely a positive electrode mass $M_p$, a negative electrode mass $M_n$, an initial charge amount $q_{0p}$ of the positive electrode, an initial, charge amount $q_{0n}$ of the negative electrode, and a resistance R that is a parameter relating to the internal resistance, can be set. In addition, in the voltage model, equation (1) and equation (2) are indicated as calculation formulae for calculating a voltage V(Q) of the battery by using a charge amount Q of the battery 5, an electric current I flowing in the battery 5, and the above-described five internal state parameters.

$$g(Q, I, \theta) = f_p(q_p) - f_n(q_n) + RI = f_p\left(\frac{Q}{M_p} + q_{0p}\right) - f_n\left(\frac{Q}{M_{12}} + q_{0n}\right) + RI \quad (1)$$

$$\theta' = [M_p, M_n, q_{0p}, q_{0n}, R]^T \quad (2)$$

Figure 2:
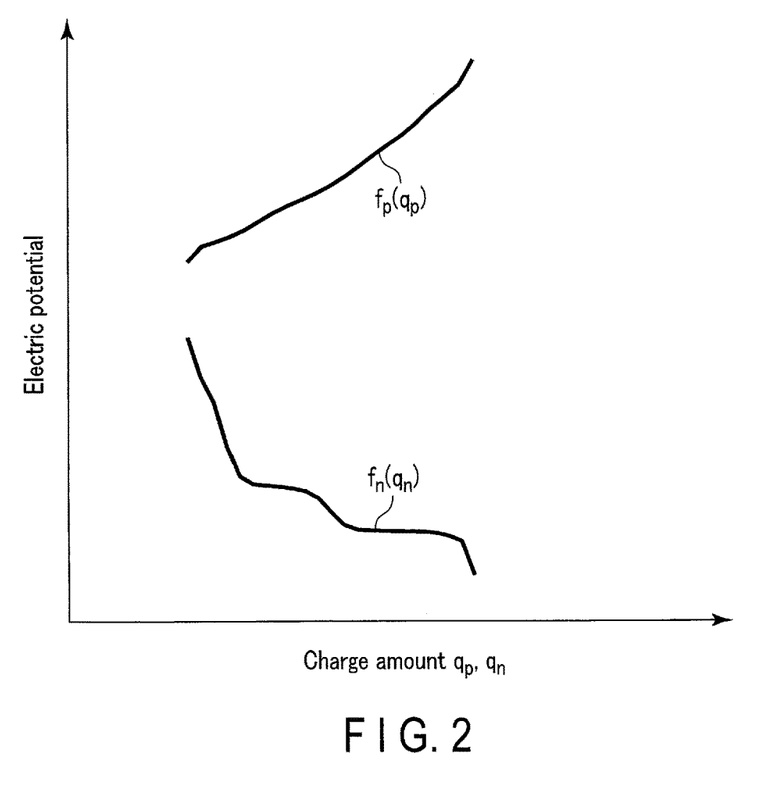
FIG. 2 is a schematic view illustrating an example of a function indicating a relation of an open circuit potential of a positive electrode to a charge amount of the positive electrode, and an example of a function indicating a relation of an open circuit potential of a negative electrode to a charge amount of the negative electrode.

In equation (1), $g(Q, I, \theta)$ is a function. In addition, $\theta$ is a vector or the like, which is indicative of the internal state of the battery 5, and $\theta$ is as indicated in equation (2) when the above-described five internal state parameters are used. Accordingly, in the voltage model for calculating the voltage V by using equation (1), the above-described five internal state parameters become variables of the function $g(Q, I, \theta)$. Furthermore, in equation (1), $q_p$ indicates a charge amount per unit mass of the positive electrode, and $f_p(q_p)$ is a function for calculating an open circuit potential (OCP) of the positive electrode from the charge amount $q_p$. Similarly, in equation (1), $q_n$ indicates a charge amount per unit mass of the negative electrode, and $f_n(q_n)$ is a function for calculating the open circuit potential of the negative electrode from the charge amount $q_n$. FIG. 2 illustrates an example of the function $f_p(q_p)$ indicative of the relation of the open circuit potential of the positive electrode to the charge amount $q_p$ of the positive electrode, and an example of the function $f_n(q_n)$ indicative of the relation of the open circuit potential of the negative electrode to the charge amount $q_n$ of the negative electrode. In FIG. 2, the abscissa axis indicates a charge amount, and the ordinate axis indicates an electric potential.

Note that a calculation formula or the like for calculating the voltage of a battery by using one or more of the above-described internal state parameters is also disclosed in reference document 1 (Jpn. Pat. Appln. KOKAI Publication No. 2012-251806) or the like. Thus, in one example, in the voltage model of the battery 5, a calculation formula for calculating the voltage of the battery 5 by using one or more of the internal state parameters, like reference document 1, may be indicated. Besides, in equation (1) or the like, the parameter relating to the internal resistance influences only a term that is proportional to the electric current I, but the embodiment is not limited to this. In one example, in the voltage model of the battery 5, a calculation formula or the like, which calculates the voltage V by taking into account the influence of the internal resistance or the like upon each of the positive electrode electric potential (positive electrode open circuit potential) and negative electrode electric potential (negative electrode open circuit potential), is indicated. In this case, in the calculation formula or the like of the voltage model, for example, the parameter relating to the internal resistance is set as a variable in each of the function $f_p$ indicative of the relation of the open circuit potential of the positive electrode to the charge amount $q_p$ of the positive electrode, and the function $f_n$ indicative of the relation of the open circuit potential of the negative electrode to the charge amount $q_n$ of the negative electrode.

In another example, as data relating to the voltage model, data indicative of an equivalent circuit, which simulates the positive electrode, negative electrode and separator of the battery 5 by taking into account a transient response or the like in the battery 5, is stored in the data storage unit 17. In addition, in the voltage model of the battery 5, a calculation formula or the like, which calculates the voltage V by using, as the parameter relating to the internal resistance, one or more parameters based on the above-described equivalent circuit, is indicated. In this case, in the calculation formula or the like of the voltage model, one or more parameters based on the equivalent circuit are set as the parameter relating to the internal resistance, or the like.

The voltage arithmetic data generation unit 12 calculates the voltage V of the battery 5 by using the calculation formula or the like indicated in the above-described voltage model, and calculates and generates a plurality of voltage arithmetic data. In each of the voltage arithmetic data, for example, the relation of the voltage V of the battery 5 to the charge amount Q of the battery 5 is indicated. Each of the voltage arithmetic data is calculated by setting the charge amount Q of the battery 5, the electric current I of the battery 5, and one or more of the internal state parameters in the calculation formula or the like of the voltage model, and performing calculation with the set values. In the calculation of each of the voltage arithmetic data, the set internal state parameter is set to a corresponding value in the calculation formula or the like of the voltage model. In addition, with the internal state parameter being kept at the above-described corresponding value, the charge amount Q is varied to a plurality of values, and the voltage V is calculated in regard to each of the varied values of the charge amount Q, and thereby each of the plurality of voltage arithmetic data is calculated. Thus, in each of the voltage arithmetic data, the relation of the voltage V of the battery 5 to the charge amount Q in the corresponding internal state is indicated. In addition, in the calculation of each of the plural voltage arithmetic data, the measurement result included in the above-described measurement data, for example, is used as the electric current I.

In addition, the voltage arithmetic data generation unit calculates a plurality of voltage arithmetic data by setting the internal state in mutually different states in the voltage model. Specifically, the internal state that is set in the voltage model is different between the plural voltage arithmetic data. Thus, in the plural voltage arithmetic data, the relations of the voltage V of the battery 5 to the charge amount in mutually different internal states are indicated. Here, the voltage arithmetic data generation unit 12 sets one or more of the internal state parameters, which are set in the voltage model, to different values between the respective voltage arithmetic data, and calculates the plural voltage arithmetic data. Thereby, in the plural voltage arithmetic data, the internal state is set in mutually different states.

In one example, using the above equation (1) and equation (2), the plural voltage arithmetic data are calculated. In this case, one or more of the positive electrode mass $M_p$, negative electrode mass $M_n$, initial charge amount $q_{0p}$ of the positive electrode, initial charge amount $q_{0n}$ of the negative electrode and resistance R are set to different values between the respective voltage arithmetic data, and the voltage arithmetic data are calculated. Accordingly, in the plural voltage arithmetic data, one or more of the above-described five internal state parameters are set in mutually different states. For example, it is assumed that four values (level values), which are set for each of the five internal state parameters, are provided, and the plural voltage arithmetic data are calculated. In this case, the number of combinations of the five internal state parameters is $4^5$, and the voltage arithmetic data generation unit 12 generates $4^5$ voltage arithmetic data by using the voltage model. Note that the values (level values), which are set as internal state parameters in the calculation of the voltage arithmetic data using the voltage model, are set to appropriate values in accordance with thresholds or the like, which are used in the determination of the deterioration state of the battery, which will be described later.

In addition, in one example, in the calculation of the voltage V and the voltage arithmetic data using the voltage model, the measurement result of the measurement data may not be used as the current I. In this case, in the voltage model stored in the data storage unit 17, the relation of the voltage of the battery 5 to each of the charge amount of the battery 5 and the internal state of the battery 5 is indicated for each of a plurality of current values of the electric current I. In addition, in the measurement of the voltage of the battery 5 by the voltage measuring circuit 8 or the like, the electric current flowing in the battery 5 is kept with time at any one of the current values indicated in the battery model. The voltage arithmetic data generation unit 12 writes the plural voltage arithmetic data calculated as described above into the data storage unit 17.

Figure 3:
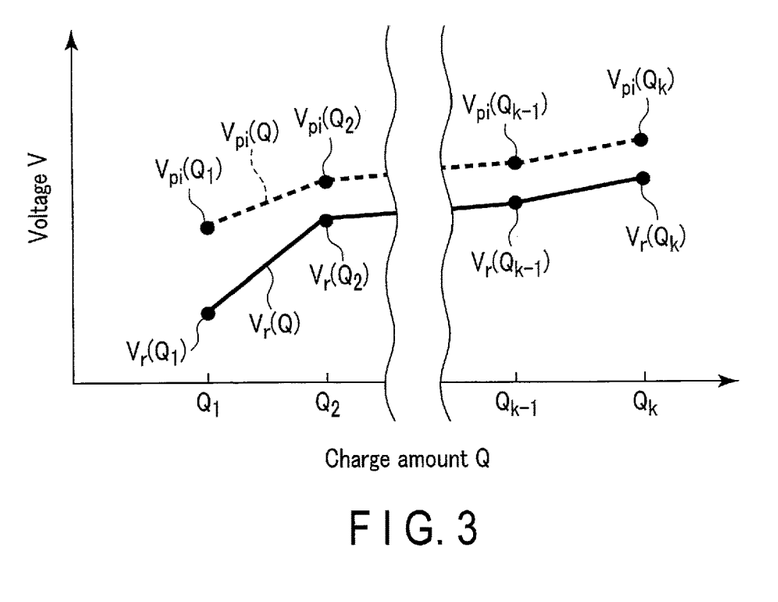
FIG. 3 is a schematic view for explaining a process in a similarity calculation unit of a diagnosis device according to the first embodiment.

The similarity calculation unit 13 acquires the above-described measurement data and plural voltage arithmetic data. In addition, the similarity calculation unit 13 calculates a similarity to the measurement result of the voltage V in regard to each of the voltage arithmetic data. Hereinafter, referring to FIG. 3, a process in the similarity calculation unit 13 will be described. In FIG. 3, the abscissa axis indicates the charge amount Q of the battery 5, and the ordinate axis indicates the voltage V of the battery 5. Here, it is assumed that an L-number of voltage arithmetic data, in which the internal state is set in mutually different states, were generated by the voltage arithmetic data generation unit 12. In addition, in the measurement result of the voltage V in the measurement data, and in each of the L-number of voltage arithmetic data, it is assumed that the voltage value of the voltage V in each of the states in which the charge amount Q becomes a plurality of values $Q_1$ to $Q_k$ is indicated. In FIG. 3, the measurement result in the measurement data is indicated by a voltage sequence $V_r$, and a certain one of L-number of voltage arithmetic data is indicated by a voltage sequence $V_{pi}$. The voltage sequence $V_{pi}$ corresponds to one of voltage sequences $V_{p1}$ to $V_{pL}$.

In one example, the similarity calculation unit 13 performs calculation by using a function h ($V_r$, $V_{pi}$) expressed by equation (3), in the calculation of the similarity of the voltage arithmetic data indicated by the voltage sequence $V_{pi}$. Thus, in the calculation of the similarity of the voltage arithmetic data indicated by the voltage sequence $V_{pi}$, a Euclidean distance (2-norm) of the voltage arithmetic data indicated by the voltage sequence $V_{pi}$, relative to the measurement result indicated by the voltage sequence $V_r$, is calculated. At this time, the calculation is performed by using values $V_{pi}(Q_1)$ to $V_{pi}(Q_k)$ in the voltage sequence $V_{pi}$ of the voltage arithmetic data, and values $V_r(Q_1)$ to $V_r(Q_k)$ in the voltage sequence $V_r$ of the measurement result.

$$h(V_r, V_{p_i}) = \|V_r - V_{p_i}\|_2 = \sqrt{(V_r(Q_1) - V_{pi}(Q_1))^2 + \ldots + (V_r(Q_k) - V_{pi}(Q_k))^2} \quad (3)$$

The similarity calculation unit 13 calculates the similarity of the voltage arithmetic data indicated by the voltage sequence $V_{pi}$ to the measurement result of the voltage V, based on the Euclidean distance calculated as described above. In addition, as regards each of the voltage arithmetic data other than the voltage arithmetic data indicated by the voltage sequence $V_{pi}$, the similarity calculation unit 13 calculates the Euclidean distance to the measurement result of the voltage V, as described above, and calculates the similarity to the measurement result of the voltage V, based on the calculated Euclidean distance. Among the plural voltage arithmetic data, voltage arithmetic data with a smaller Euclidean distance has a higher similarity.

Besides, in one example, the similarity calculation unit 13 calculates a characteristic amount of a Gaussian kernel to the measurement result of the voltage V, instead of the above-described Euclidean distance, in regard to each of the voltage arithmetic data. In addition, the similarity calculation unit 13 calculates the similarity, based on the calculated characteristic amount of the Gaussian kernel, in regard to each of the voltage arithmetic data. Here, the characteristic amount of the Gaussian kernel of the voltage arithmetic data indicated by the voltage sequence $V_{pi}$ to the measurement result indicated by the voltage sequence $V_r$ is calculated by using a function y ($V_r$, $V_{pi}$) expressed by equation (4). In equation (4), is a positive constant. The Gaussian kernel may be normalized. Among the plural voltage arithmetic data, voltage arithmetic data with a greater characteristic amount of the Gaussian kernel has a higher similarity.

$$y(V_r, V_{p_i}) = \exp(-\gamma(\|V_r - V_{p_i}\|_2)^2) \quad (4)$$

Furthermore, the similarity calculation unit 13 may calculate the similarity of each of the voltage arithmetic data by using a characteristic amount other than the Euclidean distance and the Gaussian kernel. In this case, for example, a Restricted Boltzmann Machine, which is one kind of neural network, may be pretrained, and the pretrained Restricted Boltzmann Machine may calculate the above-described characteristic amount by using a nonlinear function. In the pretraining by the Restricted Boltzmann Machine, use is made of, for example, premeasured voltage data of the battery 5, and voltage data of the battery 5 precalculated by simulation or the like. The pretrained Restricted Boltzmann Machine calculates a characteristic amount with a lowered dimension, and the comparison between the plural voltage arithmetic data and the calculation of the similarity of each of the voltage arithmetic data are executed based on the characteristic amount with the lowered dimension. The similarity calculation unit 13 writes the similarity, which is calculated for each of the voltage arithmetic data, into the data storage unit 17.

The parameter estimation unit 15 acquires the similarity calculated by the similarity calculation unit 13 in regard to each of the voltage arithmetic data. In addition, the parameter estimation unit 15 estimates at least one of the internal state and the battery capacitance of the battery 5, based on the similarity calculated in regard to each of the voltage arithmetic data. In one example, the internal state of the battery 5 is estimated based on the internal state in the voltage arithmetic data with the highest similarity among the plural voltage arithmetic data. In this case, the estimation value of each of the internal state parameters of the battery 5 is estimated to be a set value in the voltage arithmetic data with the highest similarity.

In another example, among the plural voltage arithmetic data, voltage arithmetic data having a similarity of a reference value or more is extracted. In addition, as regards the internal state, i.e. as regards each of one or more internal state parameters, an average value or a weighted average value in the extracted voltage arithmetic data is calculated. When the weighted average value is calculated, a greater weight is set for voltage arithmetic data having a higher similarity among the voltage arithmetic data having similarities of the reference value or more. Further, the internal state of the battery 5 is calculated and estimated, based on the calculated average value or weighted average value. In this case, the estimation value of each of the internal state parameters of the battery 5 is estimated to be the calculated average value or weighted average value.

Besides, the battery capacitance of the battery 5 can be estimated based on the estimated internal state. The parameter estimation unit 15 estimates the battery capacitance of the battery 5, for example, based on the estimated internal state of the battery 5, and a condition in charge and discharge of the battery 5. Here, in the battery 5, as regards the voltage V, a lower-limit voltage $V_L$ and an upper-limit voltage $V_H$ are defined, and the voltage V varies between the lower-limit voltage $V_L$ and upper-limit voltage $V_H$ in accordance with the variation of the charge amount Q of the battery 5, or the like. The voltage V increases as the charge amount Q of the battery 5 becomes greater.

In one example, it is assumed that the condition in charge and discharge of the battery 5 is defined as follows. Specifically, in the state in which constant-current charge for keeping the current I constant with time is being executed, the constant-current-charge is switched to constant-voltage charge for keeping the voltage V at the upper-limit voltage $V_H$ with time, when the voltage V has risen to the upper-limit voltage $V_H$. In addition, in the state in which the constant-voltage charge is being executed, when the current I has lowered to a charge terminate current $I_t$, the charge amount Q of the battery 5 is regarded as having reached an upper-limit charge amount $Q_H$, and the charge is stopped. Specifically, the battery 5 is regarded as having entered the completely charged state (fully charged state), and the charge is stopped. In addition, in the discharge of the battery 5, constant-current discharge for keeping the current I at a discharge current $I_c$ with time is executed. Then, in the discharge, when the voltage V has lowered to the lower-limit voltage $V_L$, the charge amount Q of the battery 5 is regarded as having reached a lower-limit charge amount $Q_L$, and the discharge is stopped. Specifically, the battery 5 is regarded as having entered the completely discharged state, and the discharge is stopped.

When the above-described condition is defined as the condition of charge and discharge of the battery 5, for example, a value obtained by subtracting the lower-limit charge amount $Q_L$ from the upper-limit charge amount $Q_H$ is defined as a battery capacitance FCC which is equivalent to the chargeable/dischargeable amount of the battery 5. In this case, the battery capacitance FCC is defined as expressed by equation (5). In addition, if a vector $\theta_e$ indicative of the internal state of the battery 5 estimated as described above is defined, equation (6) and equation (7) are established from the relation between the voltage V and function $g(Q, I, \theta)$ indicated in equation (1). Accordingly, by using equation (5) to equation (7), the battery capacitance FCC of the battery 5 is estimated based on the estimated internal state of the battery 5, and the condition in charge and discharge of the battery 5.

$$FCC = Q_H - Q_L \qquad (5)$$

$$g(Q_H, I_t, \theta_e) = V_H \qquad (6)$$

$$g(Q_L, I_c, \theta_e) = V_L \qquad (7)$$

In another example, as the condition in charge and discharge of the battery 5, only the upper-limit voltage $V_H$ and lower-limit voltage $V_L$ are set, and the charge terminate current $I_t$ or the like is not set. In this case, the battery capacitance FCC can be calculated by setting each of the above-described charge terminate current $I_t$ and discharge current $I_c$ to 0 in equation (5) to equation (7). Further, the estimated battery capacitance FCC becomes a value based on the open circuit voltage of the battery 5. Note that the battery capacitance may be indicted by a unit such as (mA·h), or may be indicated by a ratio to the capacitance at the time of the start of use of the battery 5, i.e. a battery capacity retention ratio.

In one example, before the above-described similarity is calculated in regard to each of the voltage arithmetic data, the voltage arithmetic data generation unit 12 or the like may calculate the battery capacitance, based on the set internal state (one or more internal state parameters), in regard to each of the voltage arithmetic data. In this case, for example, like the above-described process in the parameter estimation unit 15, in regard to each of the voltage arithmetic data, the battery capacitance is calculated based on the set internal state, and the condition in charge and discharge of the battery 5, or the like.

In addition, when the battery capacitance is calculated for each of the voltage arithmetic data, the parameter estimation unit 15 can estimate the battery capacitance FCC of the battery 5, based on the similarities and battery capacitances of the plural voltage arithmetic data, even without estimating the internal state of the battery 5. In this case, like the estimation, based on the similarity, of the internal state of the battery 5, the battery capacitance FCC of the battery 5 is estimated based on the similarity or the like of each of the plural voltage arithmetic data. The parameter estimation unit 15 writes the internal state and/or battery capacitance of the battery 5, which is estimated as described above, into the data storage unit 17.

The deterioration state determination unit 16 acquires the internal state and/or battery capacitance estimated by the parameter estimation unit 15. Then, the deterioration state determination unit 16 determines the deterioration state of the battery 5, based on the estimated internal state and/or battery capacitance of the battery 5. In the determination of the deterioration state, for example, ranks corresponding to the deterioration state of the battery 5 are set, and the deterioration state is evaluated based on the ranks. In one example, four ranks A1 to A4 are set for the deterioration state of the battery 5. In addition, rank A1 indicates that the deterioration state of the battery 5 is equal to or substantially equal to the state of a new battery, and rank A2 indicates such a deterioration state of the battery 5 that the battery 5 can be reused in devices other than the battery-mounted device 2. Further, rank A3 indicates that a more detailed examination (measurement) is necessary as to whether the battery 5 can be reused in devices other than the battery-mounted device 2, and rank A4 indicates that the battery 5 deteriorates to such a degree that the battery 5 cannot be reused in devices other than the battery-mounted device 2.

In one example, based on the estimated battery capacitance FCC, the deterioration state determination unit 16 sets any one of ranks A1 to A4 as an index indicative of the deterioration state of the battery 5. When the estimated battery capacitance FCC is a threshold (first threshold) FCCth1 or more, rank A1 is set as the deterioration state of the battery 5, and, when the estimated battery capacitance FCC is a threshold (second threshold) FCCth2 or more and is less than the threshold FCCth1, rank A2 is set as the deterioration state of the battery 5. Further, when the estimated battery capacitance FCC is a threshold (third threshold) FCCth3 or more and is less than the threshold FCCth2, rank A3 is set as the deterioration state of the battery 5, and when the estimated battery capacitance FCC is less than the threshold FCCth3, rank A4 is set as the deterioration state of the battery 5.

In the above setting of ranks based on the battery capacitance FCC, for example, when the estimated battery capacity retention ratio is 100%, the deterioration state of the battery 5 is set to rank A1, and, when the estimated battery capacity retention ratio is 85%, the deterioration state of the battery 5 is set to rank A2. Further, when the estimated battery capacity retention ratio is 70%, the deterioration state of the battery 5 is set to rank A3, and, when the estimated battery capacity retention ratio is 60%, the deterioration state of the battery 5 is set to rank A4. Accordingly, the setting of the rank and the determination of the deterioration state are executed based on within which of the ranges classified by the thresholds FCCth1 to FCCth3 the value of the estimated battery capacitance FCC falls.

Note that, in one example, the rank indicative of the deterioration state of the battery 5 may be set based on any one of the estimated internal state parameters, instead of the battery capacitance. In this case, thresholds similar to the thresholds FCCth1 to FCCth3 are set for any one of the internal state parameters such as the positive electrode capacitance and negative electrode capacitance. Then, the setting of the rank and the determination of the deterioration state are executed based on within which of the ranges classified by the thresholds the estimation value of the internal state parameter, for which the thresholds are set, falls. Note that in the calculation of the voltage arithmetic data using the above-described voltage model, the internal state parameter, for which the thresholds are set, is set to proper values corresponding to the thresholds.

In addition, the determination of the deterioration state of the battery 5, including the setting of the rank, may be executed based on plural among the battery capacitance and the internal state parameters, which are estimated by the parameter estimation unit 15. The deterioration state determination unit 16 writes in the data storage unit 17 the determination result of the deterioration state of the battery 5, including the set rank or the like. Besides, the deterioration state determination unit 16 may notify, via a user interface or the like, the user or the like of the battery-mounted device 2 of the determination result of the deterioration state of the battery 5. In this case, for example, the determination result is notified by either screen display or voice, or the like.

Figure 4:
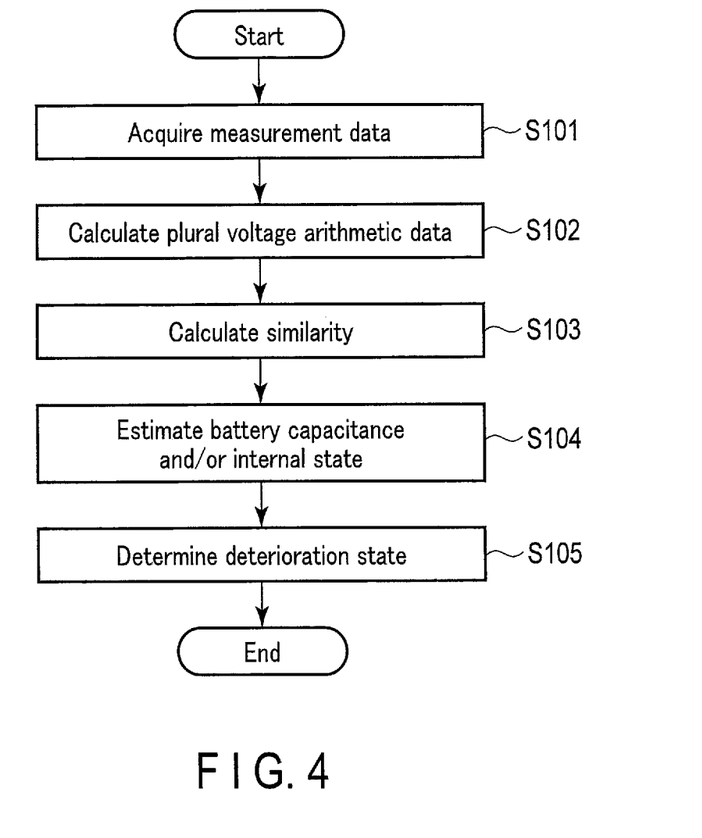
FIG. 4 is a flowchart illustrating a process which is executed by the diagnosis device according to the first embodiment.

FIG. 4 is a flowchart illustrating a process which is executed by the diagnosis device 3 according to the first embodiment. The process of FIG. 4 is executed by the diagnosis device 3 at each time of diagnosis of one battery 5. Note that, in one example, the diagnosis of the battery 5, including the process of FIG. 4, is automatically executed at a predetermined timing. In another example, the diagnosis of the battery 5, including the process of FIG. 4, is executed based on the input of an operational instruction through a user interface by the user or the like of the battery-mounted device 2.

If the process of FIG. 4 is started, the transmission-reception unit 11 acquires the above-described measurement data (S101). Thereby, the measurement result or the like of the voltage of the battery 5 in the state in which the battery 5 is being charged or discharged is acquired. Then, using the calculation formula or the like indicated in the voltage model, the voltage arithmetic data generation unit 12 calculates the voltage V of the battery 5, and calculates a plurality of voltage arithmetic data (S102). Subsequently, the similarity calculation unit 13 calculates the similarity to the measurement result of the voltage V in regard to each of the plural voltage arithmetic data (S103). Further, the parameter estimation unit 15 estimates at least one of the internal state and the battery capacitance of the battery 5, based on the similarity calculated in regard to each of the voltage arithmetic data (S104). Then, the deterioration state determination unit 16 determines the deterioration state of the battery 5, based on the estimated internal state and/or battery capacitance of the battery 5 (S105). At this time, for example, the rank or the like is set as the index indicative of the deterioration state of the battery 5.

As described above, in the present embodiment, the similarity to the measurement result of the voltage V of the battery 5 is calculated in regard to each of the plural voltage arithmetic data which are calculated by setting the internal state in mutually different states in the voltage model of the battery 5. In addition, based on the similarity calculated for each of the voltage arithmetic data, the index indicative of the deterioration state of the battery 5, such as the battery capacitance and/or internal state parameters, is estimated, and the deterioration state of the battery 5 is determined. Thus, in the determination of the deterioration state of the battery 5, there is no need to measure the battery capacitance by, for example, discharging the battery 5 from the completely charged state (the state in which the charge amount is the upper-limit charge amount $Q_H$) to the completely discharged state (the state in which the charge amount is the lower-limit charge amount $Q_L$), or there is no need to measure impedance characteristics of the battery 5, for example, by passing an alternating current through the battery 5 in a wide range of frequencies. Therefore, the determination of the deterioration state of the battery 5 can quickly and efficiently be executed.

In addition, the impedance of the battery 5 or the like is affected not only by the influence from the deterioration state of the battery 5, but is also greatly affected by the influence from the temperature and an SOC (state of charge) of the battery 5, for instance. In the present embodiment, since the battery capacitance and the internal state, or the like, are estimated as described above, the battery capacitance and the internal state, or the like, can more appropriately be estimated, for example, compared to the case of measuring the impedance characteristics of the battery 5 by an alternating current or the like, and estimating the battery capacitance and internal state of the battery 5, based on the measured impedance. The deterioration state of the battery is properly determined by the appropriate estimation of the battery capacitance and internal state, or the like, serving as the index indicative of the deterioration state of the battery 5.

For example, when a vehicle that is one of battery-mounted devices is discarded, there is a case where the deterioration state of each of many batteries mounted in the vehicle is determined, and it is determined whether each battery can be reused for another battery-mounted device such as a stationary power source or a household power source. In this case, even when the deterioration states of many batteries are determined, the deterioration states can quickly and efficiently be determined by determining the deterioration state of each battery as described above. In other words, whether each of many batteries can be reused or not is quickly and efficiently determined. Furthermore, in the present embodiment, the deterioration state of the battery is properly determined as described above. Therefore, whether each of many batteries can be reused or not is appropriately determined.

Verification Relating to the Embodiment

Figure 5:
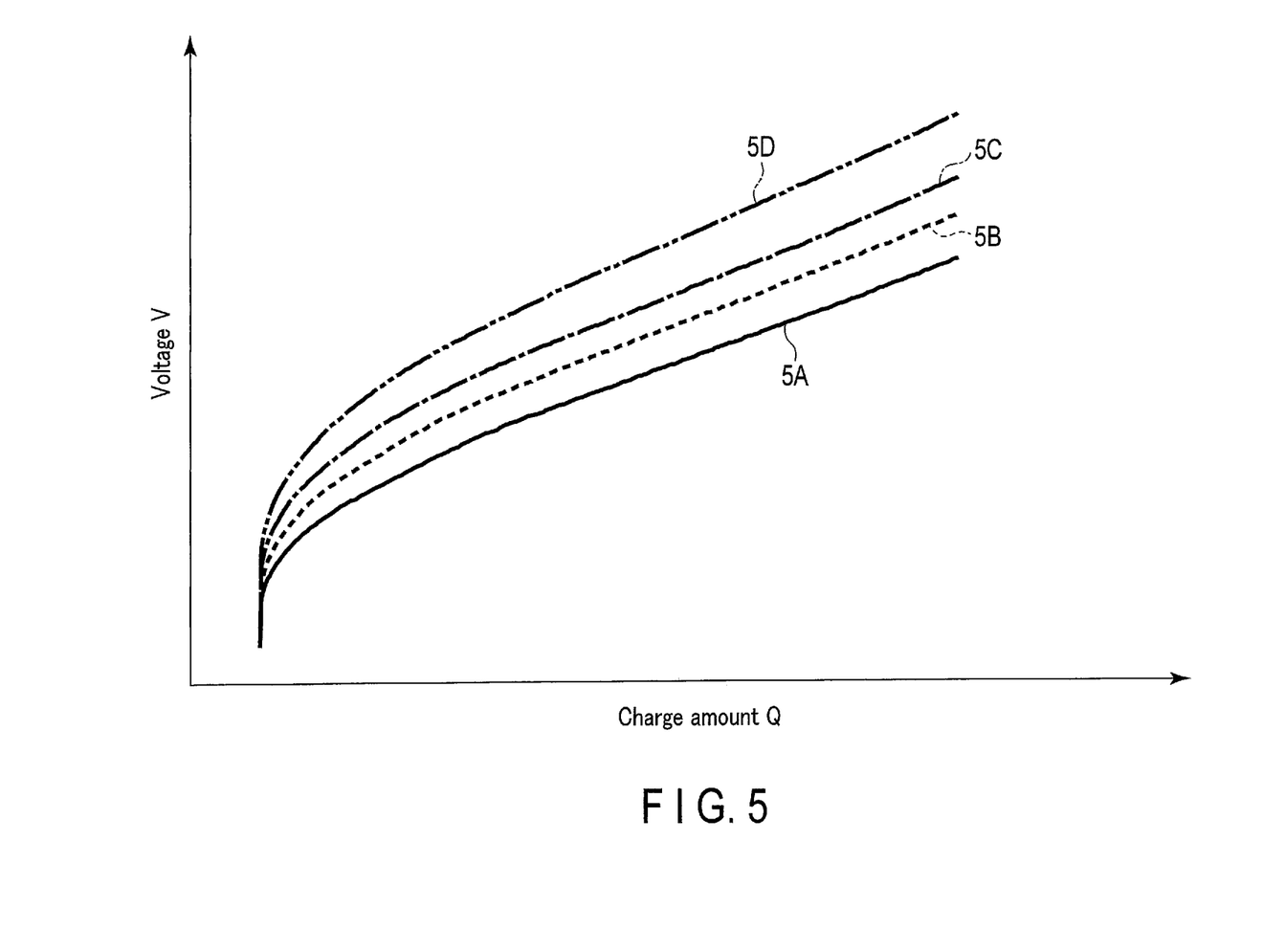
FIG. 5 is a schematic view illustrating measurement results of voltages of four batteries in verification relating to the embodiment.

The following verification was conducted in connection with the determination of the deterioration state of the battery by the above-described embodiment or the like, and the diagnosis of the battery. In the verification, like the above-described embodiment or the like, the deterioration state was determined in regard to each of four batteries 5A to 5D. In the verification, at first, each of the batteries 5A to 5D was charged, and the variation with time of the voltage V during charging was measured in regard to each of the batteries 5A to 5D. In addition, as regards each of the batteries 5A to 5D, the relation of the voltage V to the charge amount Q of the battery was acquired as measurement data. FIG. 5 illustrates measurement results of voltages V of the four batteries 5A to 5D in the verification. In FIG. 5, the abscissa axis indicates the charge amount Q of the batteries, and the ordinate axis indicates the voltage V of the batteries.

In addition, in the verification, using the above equation (1) and equation (2), a plurality of voltage arithmetic data were calculated. At this time, four values (level values) to be set were provided for each of the five internal state parameters of equation (1), and the plural voltage arithmetic data were calculated. Thus, the number of combinations of the five internal state parameters was $4^5$, and $4^5$ voltage arithmetic data were calculated by using the voltage model.

Furthermore, in the verification, the similarity to the measurement result of the voltage V of the battery 5A, the similarity to the measurement result of the voltage V of the battery 5B, the similarity to the measurement result of the voltage V of the battery 5C, and the similarity to the measurement result of the voltage V of the battery 5D were calculated in regard to each of the $4^5$ voltage arithmetic data. At this time, the respective similarities were calculated based on the Euclidean distance.

In addition, in the verification, the internal state of the battery 5A was estimated based on the similarity of each of the $4^5$ voltage arithmetic data to the measurement result of the voltage V of the battery 5A. At this time, the internal state parameter was estimated to be the set value in the voltage arithmetic data having the highest similarity to the measurement result of the voltage V of the battery 5A among the $4^5$ voltage arithmetic data. In other words, the internal state parameter was estimated to be the set value in the voltage arithmetic data having the least Euclidean distance to the measurement result of the voltage V of the battery 5A among the $4^5$ voltage arithmetic data. Like the internal state of the battery 5A, the internal state of each of the batteries 5B to 5D was estimated based on the similarities of the $4^5$ voltage arithmetic data.

Besides, in the verification, as regards each of the batteries 5A to 5D, the battery capacitance FCC was calculated and estimated based on the estimated internal state and the condition in charge and discharge. At this time, using the above equations (5) to (7), the battery capacitance FCC of each of the batteries 5A to 5D was calculated. Moreover, in the verification, the effectiveness was confirmed in regard to the calculation value of the battery capacitance. FCC of each of the batteries 5A to 5D, which was calculated as described above. Thus, in the verification, as a process which is not executed in the above-described embodiment or the like, the battery capacitance FCC of each of the batteries 5A to 5D was measured. At this time, as regards each of the batteries 5A to 5D, the battery capacitance FCC was measured, such as by discharging each battery from the completely charged state (the state in which the charge amount is the upper-limit charge amount $Q_u$) to the completely discharged state (the state in which the charge amount is the lower-limit charge amount $Q_L$).

Figure 6:
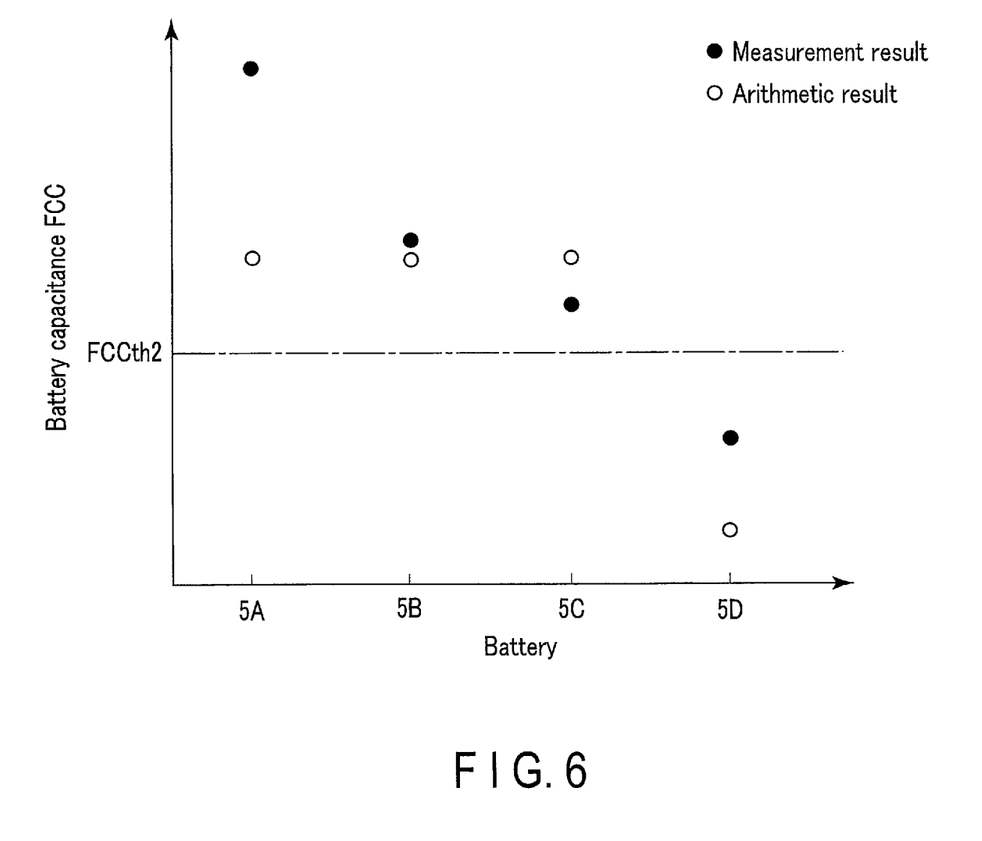
FIG. 6 is a schematic view illustrating arithmetic results calculated like the embodiment and the like, and actual measurement results, in regard to battery capacitances of the four batteries used in the verification relating to the embodiment.

FIG. 6 illustrates arithmetic results calculated like the above-described embodiment and the like, and actual measurement results, in regard to the battery capacitances FCC of the batteries 5A to 5D. In FIG. 6, the abscissa axis indicates the identification of each of the four batteries 5A to 5D, and the ordinate axis indicates the battery capacitance FCC. As illustrated in FIG. 6, in each of the batteries 5A to 5C, the battery capacitance FCC has a value falling within the range of between the threshold FCCth2 or more and less than the threshold FCCth1, in each of the arithmetic result calculated in the same manner as in the embodiment or the like, and the measurement result. Thus, in each of the batteries 5A to 5C, the index indicative of the deterioration state was rank A2 in each of the case in which the battery capacitance FCC was calculated like the embodiment or the like, and the case in which the battery capacitance FCC was measured.

In addition, in the battery 5D, the battery capacitance FCC has a value falling within the range of between the threshold FCCth3 or more and less than the threshold FCCth2, in each of the arithmetic result calculated in the same manner as in the embodiment or the like, and the measurement result. Thus, in the battery 5D, the index indicative of the deterioration state was rank A3 in each of the case in which the battery capacitance FCC was calculated like the embodiment or the like, and the case in which the battery capacitance FCC was measured. From the above verification, it was verified that proper determination is executed even when the deterioration state of the battery 5 was determined like the embodiment. In other words, the effectiveness of the determination of the deterioration state of the battery 5 in the embodiment or the like was confirmed.

In at least one of the above-described embodiments or examples, the similarity to the measurement result of the voltage of the battery is calculated in regard to each of the plural voltage arithmetic data calculated by setting the internal state in mutually different states in the voltage model of the battery. In addition, the deterioration state of the battery is determined based on the similarity calculated in regard to each of the voltage arithmetic data. Thereby, there can be provided a diagnosis method of a battery, a diagnosis device of a battery, a diagnosis system of a battery, a battery-mounted device, and a non-transitory storage medium which quickly and efficiently execute determination of the deterioration state of the battery and properly determine the deterioration state of the battery.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A diagnosis method of a battery, implemented by a diagnosis system that includes a diagnosis device, the battery diagnosed by the diagnosis device, and a battery-mounted device in which the battery is mounted, the method comprising:

by the battery-mounted device,
  measuring a measurement result of a voltage of the battery, and
  transmitting the measurement result to the diagnosis device via a network;
by processing circuitry of the diagnosis device,
  calculating a plurality of voltage arithmetic data by using a relation of a voltage of the battery to an internal state of the battery indicated in a voltage model of the battery, the plurality of voltage arithmetic data being calculated by setting the internal state in mutually different states in the voltage model, the internal state of the battery including one or more of a positive electrode capacitance, a negative electrode capacitance, a positive electrode mass, a negative electrode mass, an initial charge amount of a positive electrode, an initial charge amount of a negative electrode, a shift of operation window (SOW), and an internal resistance of the battery,
  after calculating the plurality of voltage arithmetic data, calculating a similarity to the measurement result of the voltage of the battery in regard to each of the plurality of calculated, voltage arithmetic data and outputting a deterioration state of the battery, the deterioration state being based on the similarity calculated in regard to each of the voltage arithmetic data.

2. The diagnosis method of claim 1, further comprising:
calculating the plurality of voltage arithmetic data by setting one or more internal state parameters in the voltage model of the battery,
wherein, in the calculating of the plurality of voltage arithmetic data, one or more of the internal state parameters set in the voltage model are set to different values between the voltage arithmetic data.

3. The diagnosis method of claim 1, wherein
in the calculating of each of the plurality of voltage arithmetic data,
in regard to each of the voltage arithmetic data, a Euclidean distance or a characteristic amount of a Gaussian kernel to the measurement result of the voltage of the battery is calculated, and
in regard to each of the voltage arithmetic data, the similarity is calculated based on the calculated Euclidean distance or the calculated characteristic amount of the Gaussian kernel.

4. The diagnosis method of claim 1, wherein
in the determining of the deterioration state of the battery,
at least one of the internal state of the battery and a battery capacitance of the battery is estimated based on the similarity calculated in regard to each of the voltage arithmetic data, and
the deterioration state of the battery is determined based on the estimated internal state and/or the estimated battery capacitance.

5. The diagnosis method of claim 4, wherein
in the determining of the deterioration state of the battery, the internal state of the battery and/or the battery capacitance of the battery is estimated based on an internal state and/or a battery capacitance in voltage arithmetic data which is highest in the similarity among the plurality of voltage arithmetic data.

6. The diagnosis method of claim 4, wherein
in the determining of the deterioration state of the battery,
as regards the internal state and/or the battery capacitance, an average value or a weighted average value in voltage arithmetic data with the similarity of a reference value or more among the voltage arithmetic data is calculated, and
the internal state and/or the battery capacitance of the battery is estimated based on the calculated average value or the calculated weighted average value.

7. The diagnosis method of claim 4, wherein
in the determining of the deterioration state of the battery, the deterioration state of the battery is determined based on within which of a plurality of ranges a value of the internal state and/or the battery capacitance estimated in regard to the battery falls.

8. A diagnosis system of a battery, comprising:
a diagnosis device;
the battery diagnosed by the diagnosis device;
and a battery-mounted device in which the battery is mounted,
wherein the battery-mounted device is configured to,
  measure a measurement result of a voltage of the battery, and
  transmit the measurement result to the diagnosis device via a network; and
processing circuitry of the diagnosis device is configured to
  calculate a plurality of voltage arithmetic data by using a relation of a voltage of the battery to an internal state of the battery indicated in a voltage model of the battery, the plurality of voltage arithmetic data being calculated by setting the internal state in mutually different states in the voltage model, the internal state of the battery including one or more of a positive electrode capacitance, a negative electrode capacitance, a positive electrode mass, a negative electrode mass, an initial charge amount of a positive electrode, an initial charge amount of a negative electrode, a shift of operation window (SOW), and an internal resistance of the battery,
  after calculating the plurality of voltage arithmetic data, calculate a similarity to the measurement result of the voltage of the battery in regard to each of the plurality of calculated voltage arithmetic data, and
  output a deterioration state of the battery, the deterioration state being based on the similarity calculated in regard to each of the voltage arithmetic data.

* * * * *